United States Patent [19]

Garlick

[11] Patent Number: 4,656,419

[45] Date of Patent: Apr. 7, 1987

[54] SIMPLIFIED SOLAR CELL MATERIAL TESTER

[75] Inventor: George F. J. Garlick, Los Angeles, Calif.

[73] Assignee: Hughes Aircraft Company, Los Angeles, Calif.

[21] Appl. No.: 652,554

[22] Filed: Sep. 20, 1984

[51] Int. Cl.⁴ ............................................. G01R 31/26
[52] U.S. Cl. ............................ 324/158 D; 324/158 R
[58] Field of Search ........... 324/158 R, 158 D, 158 F, 324/73 PC; 136/290

[56] References Cited

U.S. PATENT DOCUMENTS 4,333,051  6/1982  Goodman ..................... 324/158 D

FOREIGN PATENT DOCUMENTS 1211337  2/1966  Fed. Rep. of Germany ... 324/158 D
1316108  5/1973  United Kingdom ........... 324/73 PC

OTHER PUBLICATIONS

"Measurement of Minority Carrier Lifetime and Diffusion Length in Silicon Epitaxial Layers-" Müller et al., 2/78.
"Preparation and Evaluation of the Properties of GaAs" Herzog, 11/62.
"Surface Treatment of Silicon for Low Recombination Velocity" by Moore et al., 3/56, RCA Rev., pp. 5-12.
"Interpretation of Steady State Surface Photovoltage Measurements in Epitaxial Semiconductor Layers", by Phillips, Solid. St. Elec., 1972, vol. 15, pp. 1097-1101.
"Diffusion Length Measurement by a Simple Photoresponse Technique", by Hovel, IEEE 12th Phot. Conf., pp. 913-916, 1976.

Primary Examiner—Reinhard J. Eisenzopf
Assistant Examiner—W. Burns
Attorney, Agent, or Firm—A. W. Karambelas; Terje Gudmestad

[57] ABSTRACT

The quality of photovoltaic semiconductor material for use in solar cells may be determined through the determination of the minority carrier diffusion length, in a simple manner. First, a thick slug or a thin plate or slice of the semiconductor material is polished on the front side, and mechanically finished in a predetermined manner on the back side. Then light at two different wavelengths, is applied to the plate, and the photovoltage and light intensity is measured first with light of one wavelength incident thereon, and then with light of the other wavelength. The ratio of the two intensities required to give the same output photovoltage determines the minority carrier diffusion length. The apparatus includes a light chopper, a photocell or thermocouple for determining relative intensity, and a simple mounting cell, for non-destructively coupling to the semiconductor sample with sensing electrodes, on the opposite sides of the sample. The circuitry may include a digital voltmeter and a microprocessor.

7 Claims, 6 Drawing Figures

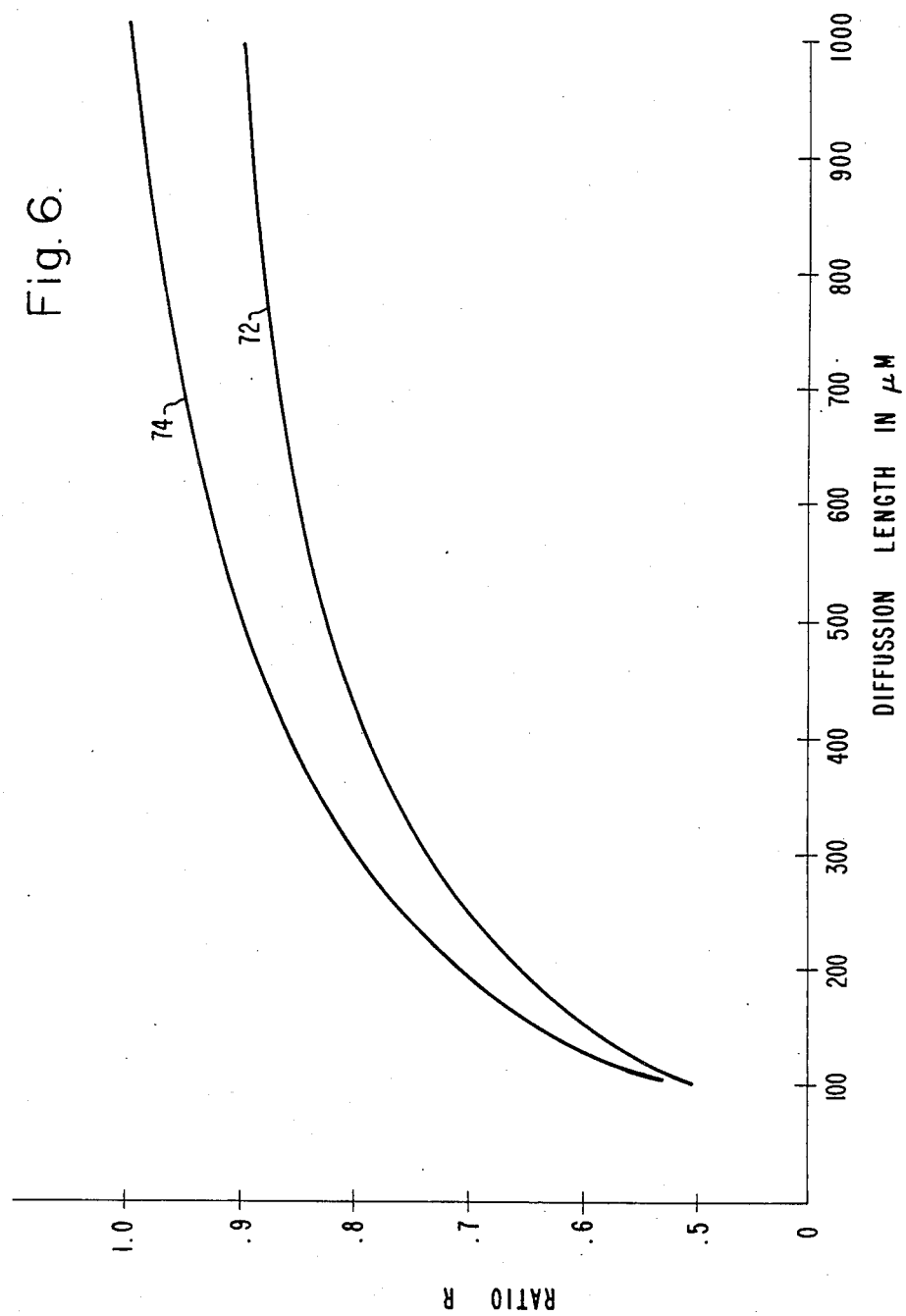

SIMPLIFIED SOLAR CELL MATERIAL TESTER

FIELD OF THE INVENTION

This invention relates to techniques for measuring solar cell material, and more particularly to techniques for measuring the minority carrier diffusion length in semiconductor material.

BACKGROUND OF THE INVENTION

Two prior techniques for measuring minority carrier diffusion length are discloses in two articles, the first being an article entitled "Minority Carrier Diffusion Length In Silicon by Measurement of Steady State Surface Photovoltage", by A. M. Goodman, which appeared in a publication entitled ANSI/ASTM F391-78, at pages 770 through 776; and the second being a paper entitled "Diffusion Length Measurement by a Simple Photoresponse Technique," by H. J. Hovel, IEEE 12th Photovoltaix Specialists Conference, pages 913 through 916, 1976). The Goodman method is only applicable to samples having thicknesses greater than three times the diffusion length. In addition, the method requires relatively skilled operation of a spectrometric system, and, for best results, a least squares computation from a collection of several data points. The Hovel technique involves the determination of short circuit current response at two different wavelengths, and the derivation of ratios for different diffusion lengths and surface recombination velocities. To accomplish the Hovel method, metallic contacts, including a Schottky barrier must be applied to all samples.

It is the principal object of the present invention to provide a simplified method for the determination of diffusion lengths which uses thin slices of the semiconductor material, which requires no special electrical contacts, and which can be performed by relatively unskilled personnel.

In accordance with the present invention, a thin slice or a thick slug of semi-conductor material is placed in a sample holder which when closed, automatically makes electricl contact with the sample on both sides. Light is applied at relatively low levels, first at one wavelength and then at another wavelength, and the photovoltage and light intensity at each wavelength are measured. From the normalized ratio of the two photovoltages or the two intensities, the minority carrier diffusion length may be determined, given the two wavelengths at which the sample was illuminated, and with other factors being standardized or known.

In accordance with special features of the invention, one or more of the following techniques may be employed:

1. A special sample cell may be provided with a lower electrode for automatically coupling to one side of a sample plate of semiconductor material, and a second electrode automatically engaging the upper surface of the semiconductor sample when the lid of the sample cell is clamped into place.
2. A light chopper may be provided for improving the signal-to-noise ratio.
3. A light filter switching arrangement may be provided for interchanging filters to obtain the desired different wavelengths.
4. A photocell or thermocouple may be provided for calibration.
5. Normalization arrangements may be provided to insure that the photovoltage readings are comparable. This may be most easily accomplished by varying the intensity of the lamp, when the different filter is interposed, to obtain the same intensity level at the photocell, or the same output photovoltage.

Advantages of the new testing technique include the simplicity of the equipment, so that it may be operated by inexperienced personnel, and could be employed in line sampling during manufacture or fabrication of solar cells; and, further, the apparatus can be employed with either thick or thin samples, and needs no special electrical contacting arrangements. This is in contrast to the one prior art technique which required only thick samples and the other prior art technique mentioned hereinabove, in which specially formulated contacts including a Schottky barrier layer, were required. Incidentally, a thin sample is one having a thickness in the order of one or two minority carrier diffusion lengths, or less.

Other objects, features, and advantages of the invention will become apparent from a consideration of the following detailed description, and from the accompanying drawings.

BRIEF DESCRIPTION OF THE DRAWINGS

FIG. 6 indicates the dependence on the type of illumination intensity detector which is employed.

DETAILED DESCRIPTION

Figure 1:
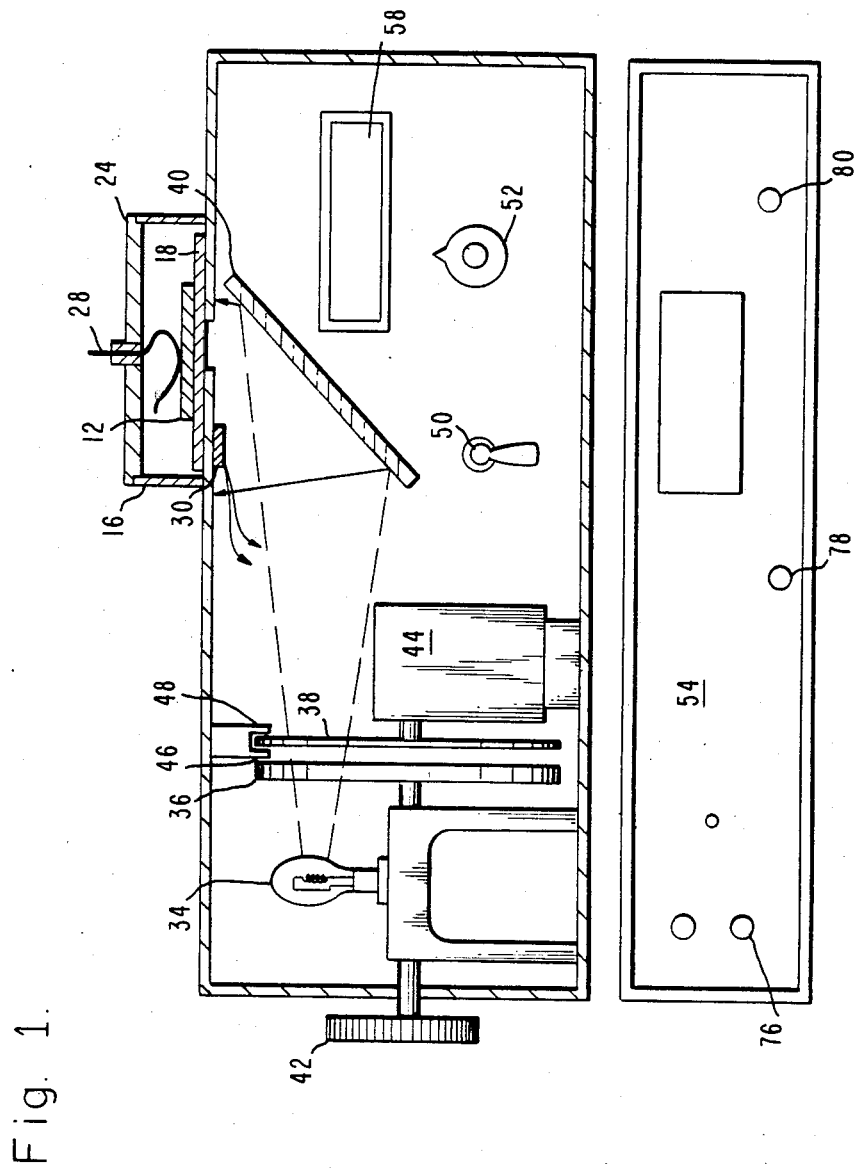
FIG. 1 is a diagrammatic view of an apparatus illustrating the principles of the invention.
Figure 2:
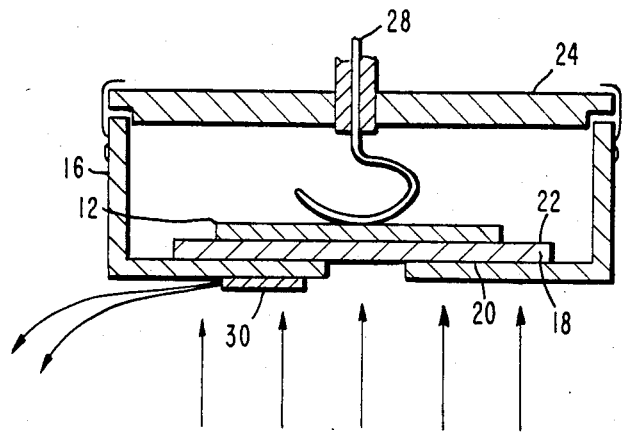
FIG. 2 is a detailed showing of a sample mount which may be employed in the implementation of the present invention.
Figure 3:
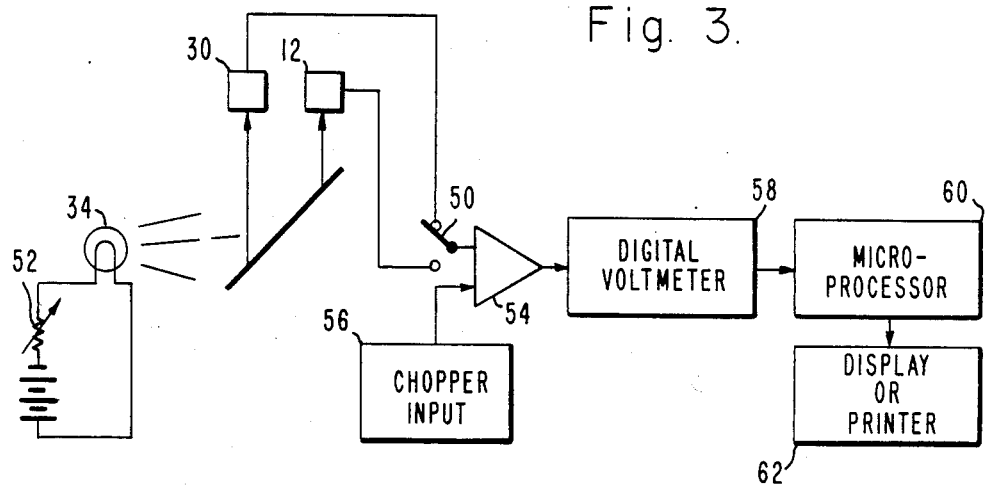
FIG. 3 is a schematic block circuit diagram of the apparatus of FIG. 1.

Referring more particularly to the drawings, FIGS. 1 through 3 show an apparatus and circuit for determining the quality of semiconductor material to be employed as solar cells. The quality of solar cell material is critically dependent upon the minority carrier diffusion length of the semiconductor material. In the present description we will first go through the mode of operation of the apparatus, and then briefly set forth the background theory.

In FIGS. 1 and 2 a semiconductor sample 12 to be tested may be in the form of a thin slice or plate or semiconductor material. In practice, the spring clamps 14 are released, and the sample 12 is placed in the sample mounting unit 16 resting on the glass plate 18, which may have either its lower surface 20 or its upper surface 22, or both, provided with a conductive coating, such as indium oxide or tin oxide. As the lid 24 is replaced, the upper spring electrical contact 26 engages the upper surface of the plate 12, so that the output photovoltage may be measured at output lead 28. It may be noted in passing that it is only the output photovoltage which is measured, not the photocurrent. Accordingly, there need be no direct electrical current to the lower surface of the plate 12. Instead, the conducting plate 20 which is the lower surface of the glass plate 18 provides a grounded capacitive reference plate. A reference cell 30, which my be either a thermocouple or a standard photovoltaic detector, provides an output signal on leads 32 indicating the intensity of illumination applied to the sample 12.

Now, referring to FIG. 1, a light source 34 provides relatively low level illumination through the filter 36, the chopper wheel 38, to the plane mirror 40 which reflects light onto the cells 12 and the standard illumination detector 30. The filter wheel 36 is provided with two or more filters which may be selectively interposed in front of the light source 34. The filters may be changed by the rotation of the handle 42.

The light chopper 38 is driven by the motor 44 to rotate, and has a number of sectors cut out from its disk-shaped configuration. Accordingly, as the disk 38 rotates, the light source 34 is interrupted, thereby interrupting the light applied to the sample 12 to be measured, and to the standard illumination detector cell 30. An additional light source such as a light emitting diode is mounted at point 46 to direct light to a matching photo transistor 48 mounted on the other side of the disk 38.

A switch 50 (see FIGS. 1 and 3) is provided for switching from the standard detector 30 to the photovoltage output from the sample 12. A variable resistor 52 controls the intensity of the light 34. Incidentally, the light 34 is a fairly low intensity incandescent lamp, such as the parking light for a car. The illumination is maintained at a low level, to insure accurate measurement of the sample 12, which could be saturated at higher light intensity levels.

A commercial "lock-in" amplifier 54 is employed to amplify the signals from the sample 12, and, separately, the signals from the standard detector 30.

The mode of operation of the circuit may be more readily understood from a consideration of FIG. 3. In FIG. 3, the same reference numerals from FIG. 2 have been employed to the extent practical. In this regard, it is understood that the block 56 designated "chopper input" actually refers to the output from the transistor 48 as interrupted by the chopper wheel 38. This provides a square wave pulse which is synchronized with the signals received through switch 50 from either the test sample 12 or the photo cell 30. With no signal from either the test sample 12 or the photo cell 30, the lock-in amplifier 54 is adjusted to provide a zero output during the positive and negative excursions of the chopper input. Then, when photovoltage is obtained as light is incident upon the sample 12 or upon the test cell 30, during one-half cycle, an additional voltage will be present at the upper input to the lock-in amplifier 54, while during the other half cycle, no such input will be present. This will provide an output to the digital volt meter 58 indicating the generated voltage. The output signals from the digital volt meter 58 may be read, and calculations done by hand, if desired. Alternatively, for production situations, a microprocessor with appropriate read-only memory (ROM) and random access memory (RAM) may be provided as indicated at 60 in FIG. 3, and the minority carrier diffusion length may be displayed or printed out by the display or printer 62 shown associated with the microprocessor 60.

In the operation of the system of FIGS. 1 through 3, the filter 36 is intially set to one of the two wavelengths at which the sample 12 is to be tested. The two principal semiconductor materials which are presently under consideration are silicon and gallium arsenide. For silicon, the two wavelengths which may be employed are 0.84 microns and 1.0 microns. As a matter of interest, these wavelengths are in the near infrared spectrum, with the visible spectrum ranging from approximately 0.4 microns to about 0.7 or 0.8 microns. In practice, the filter wheel 36 is rotated so that the light from the incandescent bulb 34 is directed through one of the two filters to impinge upon the sample 12 and the test detector 30, and the photovoltage at lead 28 is measured and recorded, or stored in the microprocessor memory. The switch 50 is then shifted to the standard detector 30, and the illumination intensity is measured and stored.

The next step is to switch to the other wavelength by changing the position of the filter wheel 36. At the new frequency, the potentiometer 52 is adjusted until the photovoltage from sample 12 is at the same value as previously recorded for the other wavelength. Then the switch 50 is moved back to detect the signal from the standard detector 30, and this value is recorded. Now, assuming that the ratio of the two readings from the standard detector 30 is a predetermined value, reference is now made to the plot of FIG. 4 by which the diffusion length in microns is plotted against this ratio. The resultant diffusion length may be read directly from the plot of FIG. 4.

Figure 4:
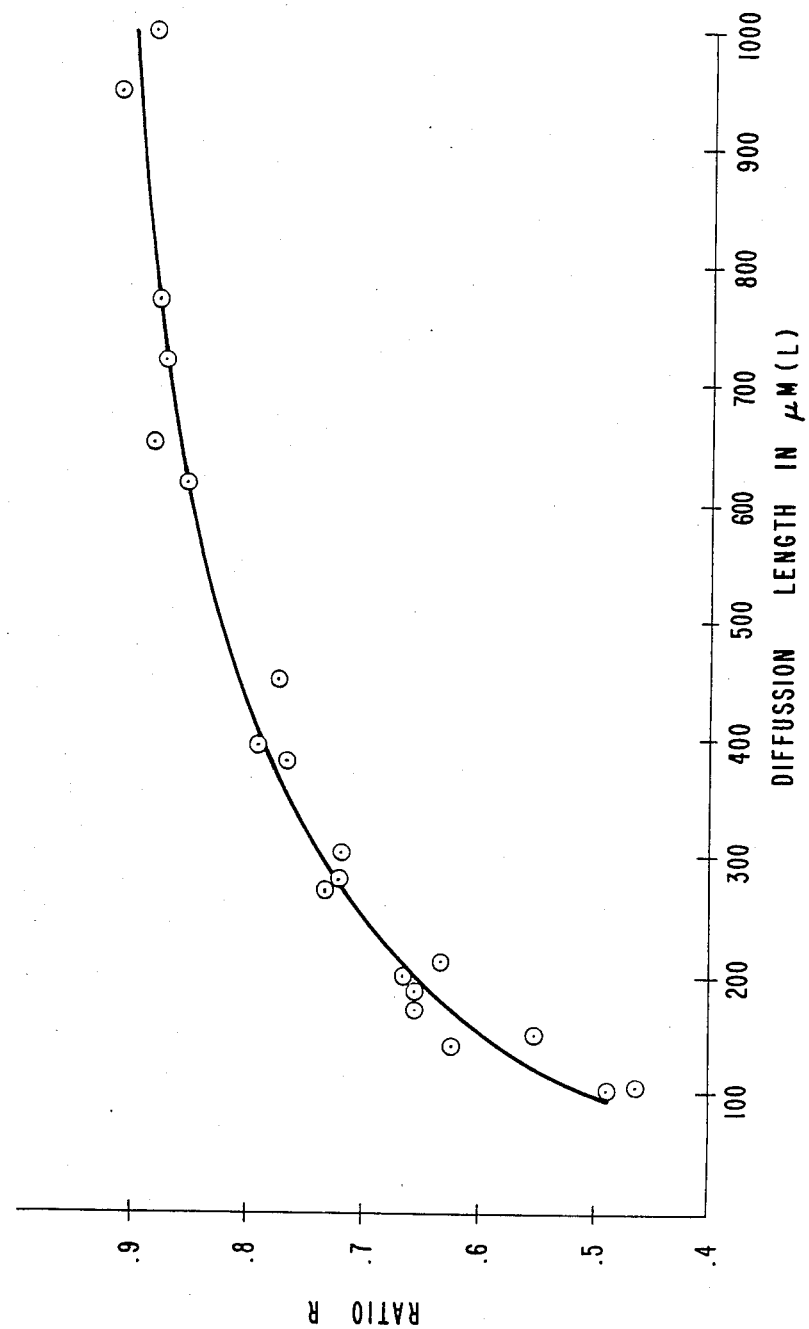
FIG. 4 is a plot of semiconductor diffusion length versus the ratio of the intensity of illumination at two different wavelengths, giving the same output photovoltage.

Incidentally, the values of diffusion length which are less than 400 microns, in FIG. 4, are for plates or "slices" which were taken from the tail of the ingot as it was drawn from the melt where it was grown.

With regard to the graph of FIG. 4, the ratio is determined by using the intensity level from the detector 30 at the 1.0 micron wavelength as the numerator of the ratio, and using the response at 0.85 microns as the denominator of the ratio. The detector response at 0.85 microns is always greater than that at 1.0 micron to give the same output photovoltage, so the ratio is normally less than 1.0.

Now, with regard to theory, reference is again made to the two articles cited hereinabove in the present specification.

When the sample thickness is several times the value of the minority carrier diffusion length, then the surface photovoltage signal amplitude, either peak-to-peak or RMS is given by the following relationship:

$$SPV \propto \frac{\alpha L}{\alpha L + 1} \quad (1)$$

where alpha is the semiconductor absorption coefficient at a given wavelength and "L" is the minority carrier diffusion length. This relation assumes that the absorption at the front side depletion layer is negligible, which is the case for the two wavelengths which are chosen in this method, 0.85 micron and 1.0 micron for silicon samples. For such "thick" ingots or samples, the effects of back-surface recombination are not involved but usually the back is lapped to give a matte surface to avoid reflection effects on the surface photovoltage signal (SPV), and intrusion of a back surface SPV effect.

When the sample is thin, i.e, equal to or less than a diffusion length, then a more complex relationship obtains, as follows:

$$SPV \propto (1 - e^{-\alpha \delta}) + \frac{e^{-\alpha \delta} \cdot \alpha L}{\alpha^2 L^2 - 1} \times \quad (2)$$

$$\left[ aL - \frac{\frac{SL}{D}\left[\cosh\left(\frac{W}{L}\right)e^{-aw}\right] + \sinh\left(\frac{W}{L}\right) + aLe^{-aW}}{\frac{SL}{D}\sinh\left(\frac{W}{L}\right) + \cosh\left(\frac{W}{L}\right)} \right]$$

where delta is the width of the so-called depletion layer at the illuminated surface of the sample, S is the back surface recombination velocity for minority carriers, D is the diffusion coefficient for the minority carriers, and W is the thickness of the sample, and where delta is much, much smaller than W.

From Function (2), it is apparent that the relationships depend to an important degree on the factor S, which is the back surface recombination velocity for minority carriers. This factor is dependent upon the surface finish. In practice, the back surface is lapped to a matte finish to avoid back reflection and to obtain maximum back surface recombination. It is also possible to prepare the back surface sample to minimize the back surface recombination velocity S, and one such method is set forth in an article by A. R. Moore and H. Nelson, R.C.A. Review, pages 5 through 12, March 1956, or as in ANSI/ASTM F 391-78.

Figure 5:
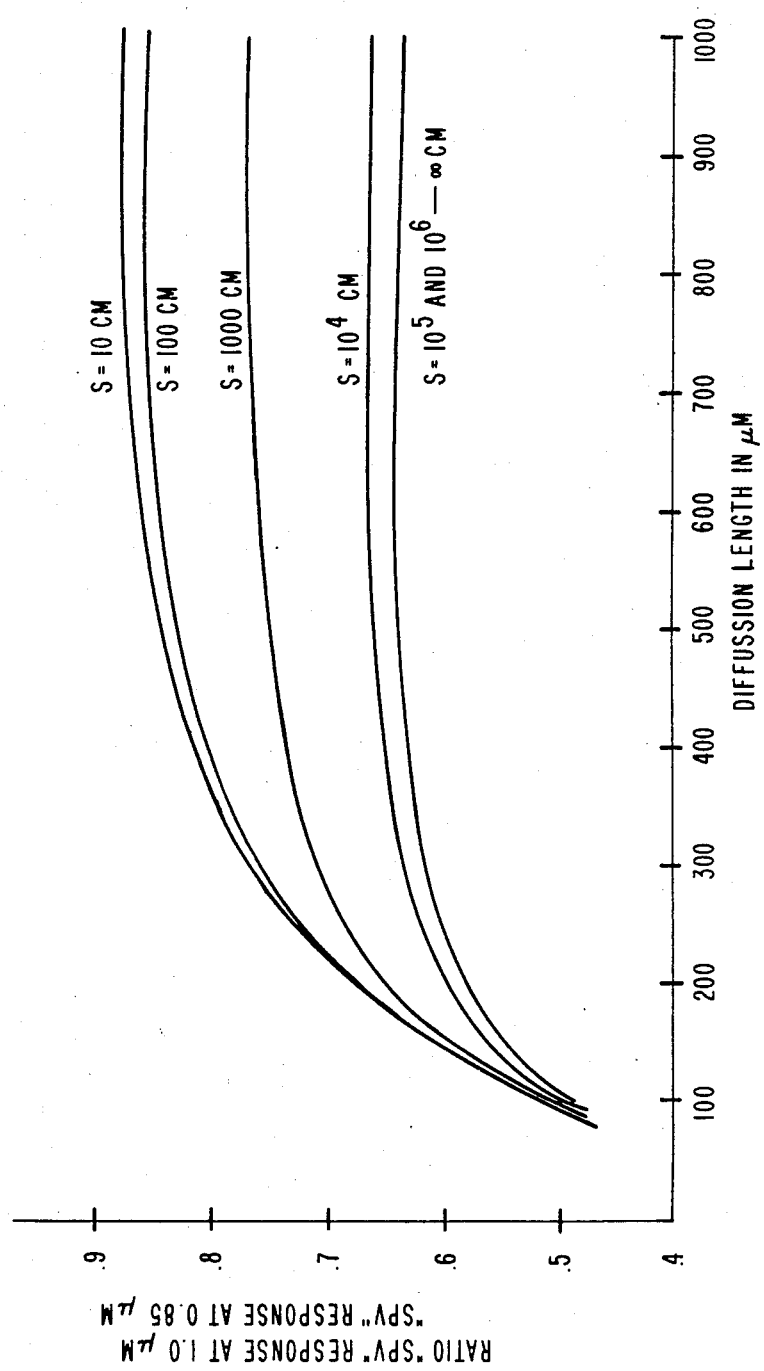
FIG. 5 shows the dependence of results on the back surface recombination velocity for the sample involving the back surface finish.

FIG. 5 is a series of plots of diffusion length in microns against the ratio discussed hereinabove with different values of S, the back surface recombination velocity. The upper curve is for very low values of S, and the lowest curve is for high values of S, and represents the results which would be obtained with samples which have been matte lapped.

FIG. 6 is another plot of diffusion length in microns plotted against the ratio discussed hereinabove, and provides two different plots, the lower plot 72 being employed when a thermocouple standard detector 30 is employed and the upper curve 74 being employed when a photovoltaic standard detector is used.

Concerning the front surface of the sample 12, it is desired that it be first mechanically polished, and then chemically etched. On a qualitative basis, if you can see a pencil reflected from the surface as the pencil is brought close to the crystal, the polish is probably adequate.

Referring back to FIG. 1, for completeness, it may be noted that certain coaxial inputs to the "lock-in" amplifier 54 have not been identified. Specifically, the input 76 to amplifier 54 comes from the switch 50, and represents either the photovoltage from sample 12, or the output of the standard detector 30. The coaxial input 78 to amplifier 54 is derived from the phototransistor 48 which senses the openings or cut away sectors in the chopper disk 38. The coaxial output 80 from amplifier 54 is coupled to the digital voltmeter 58.

As mentioned above, the preferred method involves a determination of the ratio of the incident intensities at two different wavelengths, with the same output photovoltage. However, much the same result may be achieved using a constant input intensity and determining the ratio of the two photovoltages at the different frequencies; but using a different plot of minority carrier diffusion length vs. photovoltage ratio, instead of the plot of FIG. 4. It would also be possible to use an unchanged input light source, and having different photovoltages and intensities at the two wavelengths, with normalization of the desired ratios being accomplished mathematically. However, in view of nonlinear effects which are present with different photovoltage levels, the simpler basic method of determining a ratio of input intensity levels for the two wavelengths, producing the same photovoltage, is more accurate, and is preferred. In each case, the photovoltages and/or light intensities should be normalized, either physically or mathematically, and a ratio of intensities or photovoltages employed to determine the minority carrier diffusion length.

In conclusion, it is to be understood that the foregoing detailed description and the accompanying drawings relate to an illustrative preferred embodiment of the invention. Various changes may be made without departing from the spirit and scope of the invention. Thus, by way of example, but not of limitation, instead of using a light chopper such as the disc 38, the incandescent lamp 34 or other light sorce may be modulated to provide a similar effect. In addition, instead of the filter wheel 36 carrying sets of filters for different types of semiconductor material, other arrangements for interchanging filters may be provided. Also, as mentioned hereinabove, the steps of the present method may be scheduled in a read-only memory, and the switching accomplished electronically, so that no manual operations are required other than the insertion of the sample 12 to be measured, and the energization of a "start" button. The program would be set forth either on a floppy disk, or a read-only memory, and the diffusion length displayed or printed out at 62 (see FIG. 3), following the use of a "look-up" table containing the information of FIG. 4, or other ratio being employed. Accordingly, it is to be understood that the present invention is not limited to those matters specifically disclosed in the foregoing detailed description and shown in the drawings.

What is claimed is:

1. A method for testing quality of thin slices of photovoltaic semiconductor material having a thickness of less than one minority carrier diffusion length, by determining the minority carrier diffusion lengths, comprising the steps of:

preparing a thin slice of semiconductor material by polishing one side thereof, and preparing the other side thereof with a predetermined surface finish;

coupling to both sides of said thin slice of semiconductor material with electrodes;

directing light having a predetermined first wavelength onto the polished surface of said slice;

measuring a first photovoltage developed at said electrodes while light at said first wavelength is applied to said slice;

measuring a first intensity of illumination applied to said slice at said first wavelength;

directing light having a different predetermined second wavelength onto said slice;

measuring a second photovoltage developed at said electrodes while light at said second wavelength is applied to said slice;

measuring a second intensity of illumination applied to said slice at said second wavelength;

normalizing said first and second intensities of illumination at said first and second wavelengths;

determining the ratio of said second normalized intensity of illumination with respect to said first normalized intensity of illumination; and ascertaining the minority carrier diffusion length from said ratio.

2. A method as defined in claim 1 including the step of varying the intensity of the light applied to said sample to maintain the photovoltage constant.

3. A method as defined in claim 1 including the step of interrupting or chopping the illumination applied to said sample.

4. A method as defined in claim 1 wherein said step of preparing the other side of the sample with a predetermined surface finish includes the step of lapping said other side of said sample to a matte finish.

5. A method for testing quality of photovoltaic semiconductor material having a thickness of less than one minority carrier diffusion length, for use as solar cells, by determining the minority carrier diffusion length, comprising the steps of:

preparing a thin slice of semiconductor material by polishing one side thereof, and preparing the other side thereof with a predetermined surface finish;

coupling to both sides of said thin slice of semiconductor material with electrodes;

directing light having a first predetermined wavelength onto the polished surface of said slice;

measuring a first photovoltage developed at said electrodes while light at said first wavelength is applied to said slice;

directing light having a second different predetermined wavelength onto said slice;

adjusting the light intensity so that the photovoltage developed at said electrodes while light at said second wavelength is applied to said slice is substantially the same as said first photovoltage at said first wavelength;

measuring a second intensity of illumination applied to said slice at said second wavelength;

determining the ratio of the light intensity at one of said first and second wavelengths relative to the light intensity at the other of said first and second wavelengths; and ascertaining the minority carrier diffusion length from said ratio.

6. A method as defined in claim 5 including the step of interrupting or chopping the illumination applied to said plate.

7. A method as defined in claim 5 wherein said step of preparing the other side of the sample with a predetermined surface finish includes the step of lapping said other side of said plate to a matte finish.

* * * * *